United States Patent
Coppola et al.

(10) Patent No.: US 9,635,790 B2
(45) Date of Patent: Apr. 25, 2017

(54) DEFLECTABLE CONDUCTIVE GASKET WITH ENVIRONMENTAL SEAL

(71) Applicant: PARKER-HANNIFIN CORPORATION, Cleveland, OH (US)

(72) Inventors: Stephen J. Coppola, Boston, MA (US); Michael H. Bunyan, Chelmsford, MA (US); George R. Watchko, Stoneham, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 14/372,635

(22) PCT Filed: Mar. 12, 2013

(86) PCT No.: PCT/US2013/030323
§ 371 (c)(1),
(2) Date: Jul. 16, 2014

(87) PCT Pub. No.: WO2013/138265
PCT Pub. Date: Sep. 19, 2013

(65) Prior Publication Data
US 2014/0360772 A1    Dec. 11, 2014

Related U.S. Application Data

(60) Provisional application No. 61/610,139, filed on Mar. 13, 2012.

(51) Int. Cl.
*H05K 9/00* (2006.01)
*F16J 15/06* (2006.01)
*F16J 15/12* (2006.01)

(52) U.S. Cl.
CPC .......... *H05K 9/0081* (2013.01); *F16J 15/064* (2013.01); *F16J 15/126* (2013.01);
(Continued)

(58) Field of Classification Search
CPC .... H05K 9/0015; H05K 9/0081; H05K 9/009; H05K 9/003; H05K 9/0009; H05K 9/0024; F16J 15/064; F16J 15/126
See application file for complete search history.

(56) References Cited

U.S. PATENT DOCUMENTS 3,026,367 A * 3/1962 Hartwell .............. H05K 9/0015
                                                     174/357
5,115,104 A * 5/1992 Bunyan ................ H05K 9/0015
                                                     174/356
(Continued)

FOREIGN PATENT DOCUMENTS

EP        0275171 A2    7/1988

OTHER PUBLICATIONS

International Search Report of PCT/US2013/030323 dated May 17, 2013.

(Continued)

*Primary Examiner* — Paresh Paghadal
(74) *Attorney, Agent, or Firm* — Renner, Otto, Boisselle & Sklar, LLP

(57) ABSTRACT

A deflectable gasket assembly for EMI shielding and environmental sealing is described. The gasket assembly is formed from an electrically-conductive mesh sheet positioned between adjacent conductive surfaces. A gasket is provided at the outer boundaries of the mesh sheet for environmental protection. The edge of the gasket has a branched sealing element extending above and below the gasket assembly for contacting the adjacent surfaces. The branched sealing element is deformable and can be used on external aircraft electronic components.

9 Claims, 4 Drawing Sheets

(52) U.S. Cl.
CPC .......... *H05K 9/009* (2013.01); *H05K 9/0015* (2013.01); *H05K 9/003* (2013.01); *H05K 9/0024* (2013.01)

(56) References Cited

U.S. PATENT DOCUMENTS

| | | |
|---|---|---|
| 5,655,645 A | 8/1997 | Foster |
| 2001/0000392 A1 | 4/2001 | Mitchell et al. |
| 2002/0185292 A1* | 12/2002 | Ariel .................. F16J 15/025 174/377 |
| 2003/0047885 A1 | 3/2003 | Busby et al. |
| 2012/0048612 A1 | 3/2012 | Bunyan et al. |

OTHER PUBLICATIONS

Extended European Search Report for corresponding European Application No. 13761079.6 dated Feb. 1, 2016.

* cited by examiner

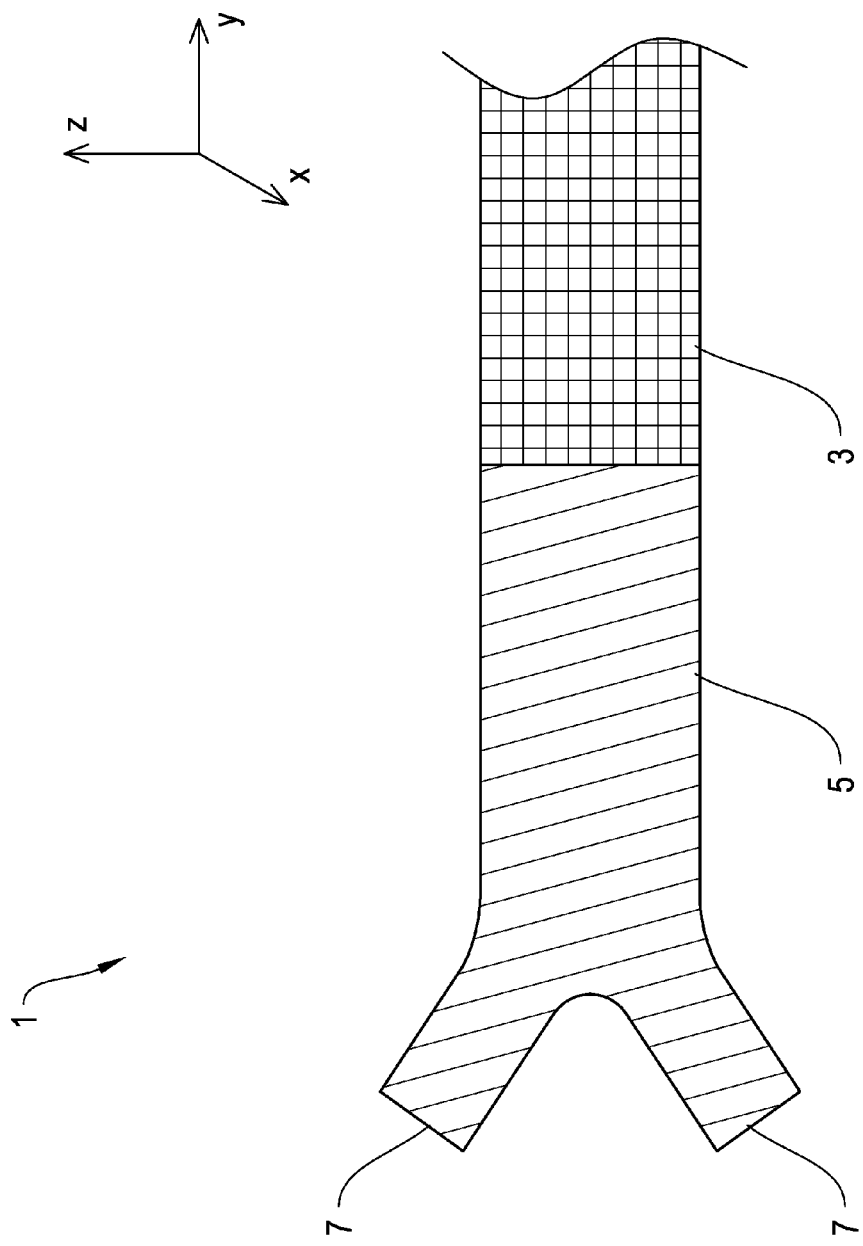

DEFLECTABLE CONDUCTIVE GASKET WITH ENVIRONMENTAL SEAL

CROSS-REFERENCE TO RELATED APPLICATIONS

This application is a national phase application of PCT/US2013/030323, filed Mar. 12, 2013, which claims the benefit of priority of U.S. Provisional Application No. 61/610,139, filed on Mar. 13, 2012, the disclosures of which are incorporated herein by reference in their entirety.

BACKGROUND OF THE INVENTION

The present invention relates to a gasket assembly for use in sealing and EMI shielding applications, and particularly for aircraft related applications. More particularly, the present invention relates to an expanded, electrically-conductive mesh sheet positioned between adjacent surfaces of an external aircraft electronics component for use in shielding and protecting components which typically generate or receive electromagnetic radiation. Such external aircraft components include, for example, aircraft antennas, beacons, altimeters, radar and telemetry devices. The expanded mesh component is sealed from the environment with a chemically resistant elastomer having a deformable branched sealing edge disposed along the end portion of the gasket. The branched sealing edge extends above and below the gasket, and serves to protect the mesh sheet from fluids which could physically damage the mesh, or adversely affect its conductivity and shielding ability.

Electronic components are typically sources of electromagnetic (EM) radiation. Electronic components, for example, transmitters, transceivers, microcontrollers, microprocessors and the like, radiate a portion of the electric signals propagating through a device as EM radiation. The EM radiation generated in this way is sometimes referred to as EM noise. Higher operating frequency ranges of the electronic components leads to EM noise that primarily comprises radio frequency (RF) radiation. This RF radiation is normally referred to as RF noise. As may be used herein, EM noise and RF noise are referred to as EM radiation emitted from an electronic device. Moreover, EM noise and RF noise, unless otherwise stated, may be used interchangeably throughout the specification. EM radiation may also be emitted from electronic devices in close proximity to each other (EMI, or electromagnetic interference).

Many electronic devices are shielded to impede the emission of EM noise, or to prevent the device from receiving unwanted EM radiation. The shield is a physical barrier typically made of various conductive materials, for example, metal sheets, conductive plastic composites, conductive polymer sprays, metal filled epoxy pastes and the like. The shield absorbs EM radiation thereby impeding the emission of EM noise from an assembly of the electronic devices and the shield.

Gaskets are also used in EMI shielding applications where flexibility in addition to shielding effectiveness is required due to the particular application. Composite gaskets generally comprising a metal core material enclosed or encapsulated within a resilient polymeric material are known in the art. Such gaskets have sufficient structural integrity to be useful in sealing components in corrosive and high performance environments, such as for pressure vessels, automotive engines and aircraft. Examples of such gaskets are disclosed in U.S. Pat. No. 2,477,267 and U.S. Pat. No. 3,126,440. The disclosure of each of these patents is incorporated by reference herein.

U.S. Pat. No. 4,900,877 discloses a gasket for EMI shielding and environmental sealing. The gasket of this patent has a metallic electrically conductive deformable element adapted to be positioned in a gap between adjacent conductive surfaces. The gap is filled with a gel for sealing the space between the surfaces and for encapsulating the metallic structure to provide environmental protection against moisture and corrosion. The disclosure of this patent is also incorporated by reference herein.

The gaskets described in the aforementioned patents may not be acceptable for high performance applications, typically aircraft applications, where a variety of performance characteristics may be required in harsh working environments. For example, in addition to EMI shielding and sealing, electrical bonding of components and protection against corrosion may be a necessity.

Many of the commercial gaskets typically have electrical contact only at the edge portion of the gasket. Most such gaskets involve a woven flat wire mesh buried within the body of the elastomer not near the surface. When the gasket is cut to size, the wire mesh is exposed at the edge of the gasket and bent up near the surface. Since the electrical contact of these gaskets and the sealed components is at the edge portion of the gasket, a caulk must be applied at the edge of the gasket to protect the wire mesh from corrosion while maintaining the electrical bonding and EMI shielding. The application and curing of the caulk requires several hours of application and curing time, increasing down time of the equipment. When a gasket is replaced, the old caulk must first be removed, and the removal procedure can result in scratches to the protective coating of the equipment, requiring repainting of the surface, thereby expanding the scope and duration of the repair. Furthermore, most caulking compounds have a limited shelf life which can create inventory obsolescence and increase associated costs.

Additional problems are created when gaskets are used in external aircraft applications, such as for antennas and beacons. In these applications, the antenna is subject to deflection due to the wind shear. This can lead to the entry of fluids into the gasket assembly, including moisture, solvents, fuel, hydraulic fluids, de-icing fluids, etc. Many of these fluids are highly corrosive, and can quickly destroy the EMI shielding capabilities of the gasket. Typically, this problem is addressed through the use of polysulfide caulking materials applied to the periphery of the antenna after assembly. This approach usually requires significant downtime due to the curing time required for the polysulfide material.

It would therefore be highly advantageous to develop a commercial gasket with a greater deflection range than presently available, and which would also be able to provide environmental sealing between mating surfaces.

Accordingly, there is a perceived need for an improved deflectable EMI gasket design, particularly in aircraft applications, that would provide for improved sealing and EMI shielding.

SUMMARY OF THE INVENTION

The present invention, in one embodiment, is directed to EMI shielding and corrosions resistant gaskets and assemblies including such gaskets. The gaskets of the invention are especially adapted for compressive placement between adjacent interface surfaces, to provide sealing and electrical conductivity between said surfaces. Advantageously, such surfaces can form part of an external aircraft fuselage, such as an external avionics package or external aircraft antenna.

The gaskets of the invention comprise a resilient, electrically-conductive mesh sheet, a chemically resistant elastomer affixed to the outer periphery of the mesh sheet, and a gel matrix material for encapsulating the mesh sheet and for protecting the expanded mesh sheet from corrosion. The mesh sheet and elastomer extend substantially in the same plane, i.e. substantially in an x-axis and y-axis (length and width) direction. In general, the thickness of the gasket is small relative to the lengthwise and the widthwise dimensions of the gasket.

The end portion of the elastomer is divided or branched in the vertical or z-axis direction, so that it extends above and below the horizontal level of the mesh sheet and elastomer. The branched end of the elastomer serves to seal and envelope the gasket assembly, and prevent the seepage of corrosive fluids into the gasket which could harm and impede the effectiveness of the gasket. Upon compression of the gasket assembly, as a result of, for instance, external compressive forces generated by air pressure on the surface of the assembly, the branched end of the gasket is deformed but retains its sealing effectiveness.

In one aspect, the branched end of the gasket is configured to resemble a forked element, i.e. the element is in the shape of a 2-pronged fork.

In another aspect, the branched end is shaped like a fillet and conforms to the aerodynamic shape of an external aircraft component, such as an external aircraft antenna.

In one embodiment, the mesh sheet is a corrugated element, generally planar in shape but slightly bent to form a series of waveforms with amplitudes extending in the vertical (z-axis) direction. The mesh sheet is formed from a conductive material, for instance, conductive metal wires or fibers. Suitable metals include, for example, copper, nickel, silver, aluminum, bronze, steel, tin, or an alloy or combination thereof. The metal fibers can also be coated with one or more of the foregoing metals. The electrically conductive fibers can be non-conductive fibers having an electrically-conductive coating, metal wires, carbon fibers, graphite fibers, inherently-conductive polymer fibers, or a combination thereof.

In one aspect, the non-conductive fibers of the mesh can be prepared from cotton, wool, silk, cellulose, polyester, polyamide, nylon, polyimide, or a combination thereof, and the electrically-conductive coating can be copper, nickel, silver, aluminum, tin, carbon, graphite, or an alloy or combination thereof.

In another aspect, the metal wires of the mesh are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

A further embodiment of the invention is directed to EMI and corrosion resistant assemblies. The assembly includes a first conductive surface spaced apart from a second conductive surface. The first and second conductive surfaces are generally opposed and parallel to each other. The gasket of the invention is interposed and in electrical contact with both the first and second surfaces, with the branched end portion of the gasket serving to seal the gasket from the external environment.

In yet another embodiment, the gasket and opposed, spaced apart surfaces are part of an external aircraft electronics device, such as an aircraft radio altimeter antenna, an aircraft weather radar antenna, an aircraft glide slope antenna, an aircraft marker beacon, an aircraft GPS antenna, and various aircraft VHF, ADF, TCAS and ATC antennae. In the external aircraft applications, it is particularly advantageous to select a branched gasket end portion design that has an aerodynamically compatible shape to reduce external drag.

The present invention, accordingly, comprises the construction, combination of elements and components, and/or the arrangement of parts and steps which are exemplified in the following detailed disclosure. The foregoing aspects and embodiments of the invention are intended to be illustrative only, and are not meant to restrict the spirit and scope of the claimed invention.

BRIEF DESCRIPTION OF THE DRAWINGS

The foregoing and other advantages and features of the invention will become apparent upon reading the following detailed description with reference to the accompanying drawings in which:

FIG. 1 is side view of one embodiment of the gasket design of the invention.

FIG. 2 is a side view of the gasket of FIG. 1 installed in an assembly.

DETAILED DESCRIPTION OF THE INVENTION

Figure 2A:
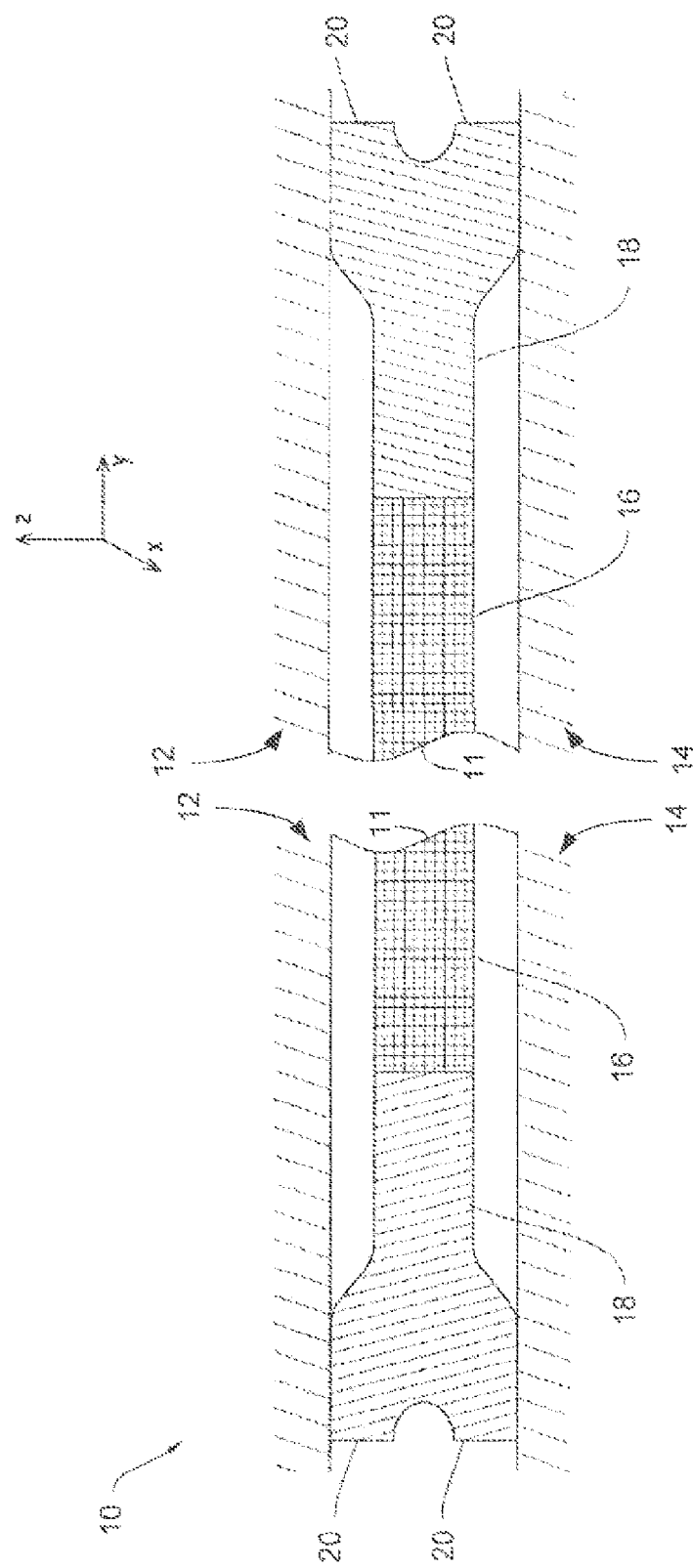
FIG. 2A is a side view of the gasket assembly under low or no compression.

The gasket of the present invention is primarily intended to be used for EMI shielding applications in environments which are subject to corrosive, hazardous and extreme conditions. These environments are typically found on the external surfaces of various types of aircraft. The gasket design includes a feature which protects the gasket from the adverse effects of the environment. This design is incorporated in the end portion of the gasket as described in more detail herein.

In particular, the gasket of this invention is intended to be used in applications requiring EMI shielding in hostile environments where corrosive liquids can contaminate the gasket and render it inoperable or severely damaged. Such environments include the external surfaces of aircraft, such as external avionics electronic equipment. As used herein, the term "aircraft" is intended to designate both commercial and military aircraft, jet and prop aircraft, including both large commercial and smaller private aircraft.

The gasket of the invention is inserted between adjacent conductive surfaces and compressed to seal the space between the surfaces. The conductive mesh component of the gasket contacts the adjacent surfaces, establishing electrical contact and producing an EMI affect. The gasket is generally a planar member, oriented horizontally in an x-axis and y-axis direction, arbitrarily the width and length of the gasket. The gasket includes an inner conductive mesh element, and a surrounding elastomeric member affixed to the outer periphery of the mesh. The outwardly extending portion of the elastomeric member is a branched element having an upper and lower portion generally extending in a vertical (z-axis) direction outside of the horizontal plane of the gasket.

The mesh element of the invention is generally a resilient, electrically conductive sheet embedded within a matrix polymer gel, preferably a conductive polymer gel. The mesh sheet can be, for example, an expanded metal mesh or a metal wire screen or a metal-plated fabric sheet. Typically, the mesh sheet may be formed from metal or metal alloy wires or fibers, graphite or carbon fibers, or metallized or metal-coated or metal plated non-conductive woven or non-woven fabric, such as nylon fabric or nylon fibers. In general, the surface resistivity of the mesh sheet is less than about 0.1 Ω/sq.

As used herein, the term "mesh" includes fabrics, cloths, webs, mats, screens, meshes and the like, which may be open, such as in the case of a screen, or closed, such as in the case of a fabric.

The mesh can be inherently conductive if formed from a metal or metal alloy, graphite, carbon, etc., as wires, monofilaments, yarns, bundles, or other fibers or materials which are inherently conductive. Alternatively, the mesh can be non-conductive and rendered electrically-conductive by means of an applied coating, plating, sputtering, or other treatment of the electrically conductive material. Representative of the inherently electrically conductive materials include metals, such as copper, nickel, silver, aluminum, steel, tin and bronze, alloys thereof, such as Monel nickel-copper alloys, non-metals, such as carbon, graphite, and inherently conductive polymers, and plated or clad wires or other fibers such as one or more of copper, nickel, silver, aluminum, steel, tin, bronze, or an alloy thereof, e.g. silver-plated copper, nickel-clad copper, Ferrex® (Parker Chomerics, Woburn, Mass.), tin-plated copper-clad steel, tin-clad copper, and tin-plated phosphor bronze. Representative non-conductive fibers include cotton, wool, silk, cellulose, polyester, polyamide, nylon, and polyimide monofilaments or yarns which are plated, clad or otherwise coated with an electrically-conductive material which may be a metal mesh such as copper, nickel, silver, aluminum, tin, or an alloy or combination thereof, or a non-metal such as carbon, graphite, or a conductive polymer. The plating, cladding or other coating may be applied to individual fiber strands or to the surface of the fabric after weaving, knitting or other fabrication. Combinations of one or more of the foregoing conductive fibers and/or one or more of the foregoing coated non-conductive fibers may also be employed.

The mesh sheet of the invention can be a corrugated member as more fully described in commonly assigned U.S. patent application Ser. No. 13/103,922, filed May 9, 2011, the disclosure of which is incorporated by reference herein in its entirety. As explained in the aforementioned patent application, the corrugation technique provides a series of waveforms to permit distortion of the mesh sheet in the thickness direction (z-axis). These waveforms can also reduce the compression forces necessary to establish contact with the opposing conductive surfaces of the assembly. Typically, the mesh sheet is an expanded metal mesh, a metal wire screen, or a metal-plated fabric sheet.

The chemically resistant elastomer can be formed from any number of suitable elastomeric materials, including by way of example, polyethylene, polypropylene, polypropylene-EPDM blends, butadiene, styrene-butadiene, nitrile rubber, chlorosulfonate, neoprene, urethane, polytetrafluoroethylene, polysulfide, silicone, or a copolymer, blend or combination of any of the foregoing polymers.

FIG. 1 illustrates the EMI and environmental gasket 1 of the invention. The gasket includes expanded metal mesh sheet 3, which forms the core of the gasket (in this case a sheet), and chemically resistant elastomer 5 affixed to the external periphery of expanded metal mesh sheet 3. The end portion of the elastomer is branched element 7, which is designed to prevent the contamination of gasket 1, primarily through contact with external corrosive fluids. The gasket extends in the horizontal plane, or along the x-axis and y-axis, representing the width and length of the gasket.

A gel matrix material is typically applied to the expanded metal mesh to encapsulate the mesh sheet prior to emplacement of the gasket between opposed conductive surfaces. The encapsulation of the mesh sheet can be accomplished using known encapsulation techniques, and aids in the prevention of corrosion of the expanded mesh. See, in this regard, U.S. Pat. No. 6,695,320, the disclosure of which is incorporated herein by reference in its entirety.

Figure 2B:
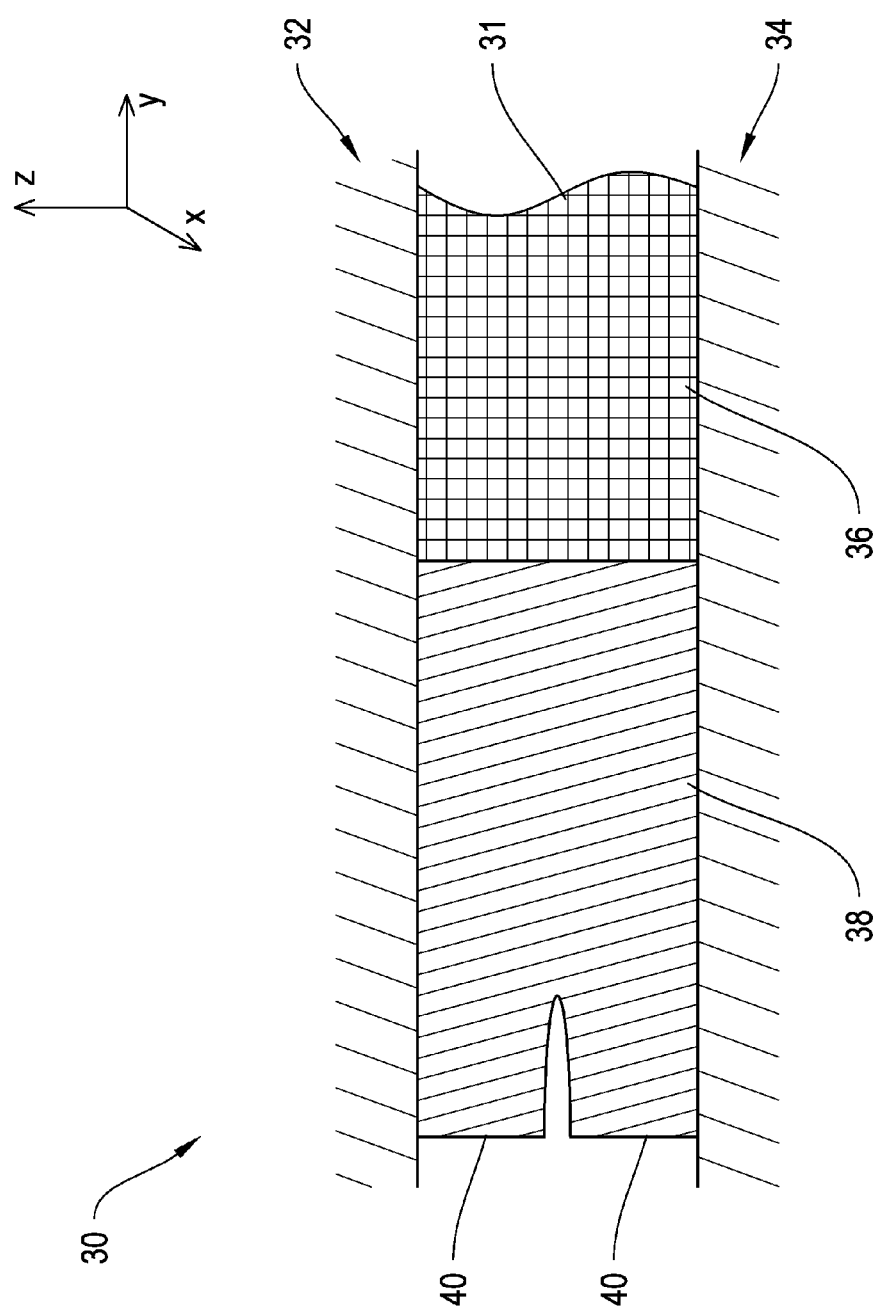
FIG. 2B is a side view of the gasket under high compression.

FIGS. 2A and 2B illustrate the use of the gasket of FIG. 1 in an electronics application, such as part of an external aircraft antenna mount. FIG. 2A shows a gasket assembly 10 with gasket 11 in an uncompressed or low compression state. Gasket 11 is positioned between adjacent conductive elements 12 and 14. Conductive elements 12 and 14 can form part of an external aircraft antenna. As shown, gasket 11 comprises expanded metal mesh 16 and chemically resistant elastomer 18. The branched end portions 20 of the gasket are shown in a slightly compressed configuration.

FIG. 2B shows gasket assembly 30 with gasket 31 in a highly compressed state between conductive surfaces 32 and 34. Gasket 30 includes expanded metal mesh 36 and chemically resistant elastomer 38 having branched ends 40. The branched ends of the gasket are shown compressed between the conductive surfaces, leaving only a small gap between the ends.

Figure 3:
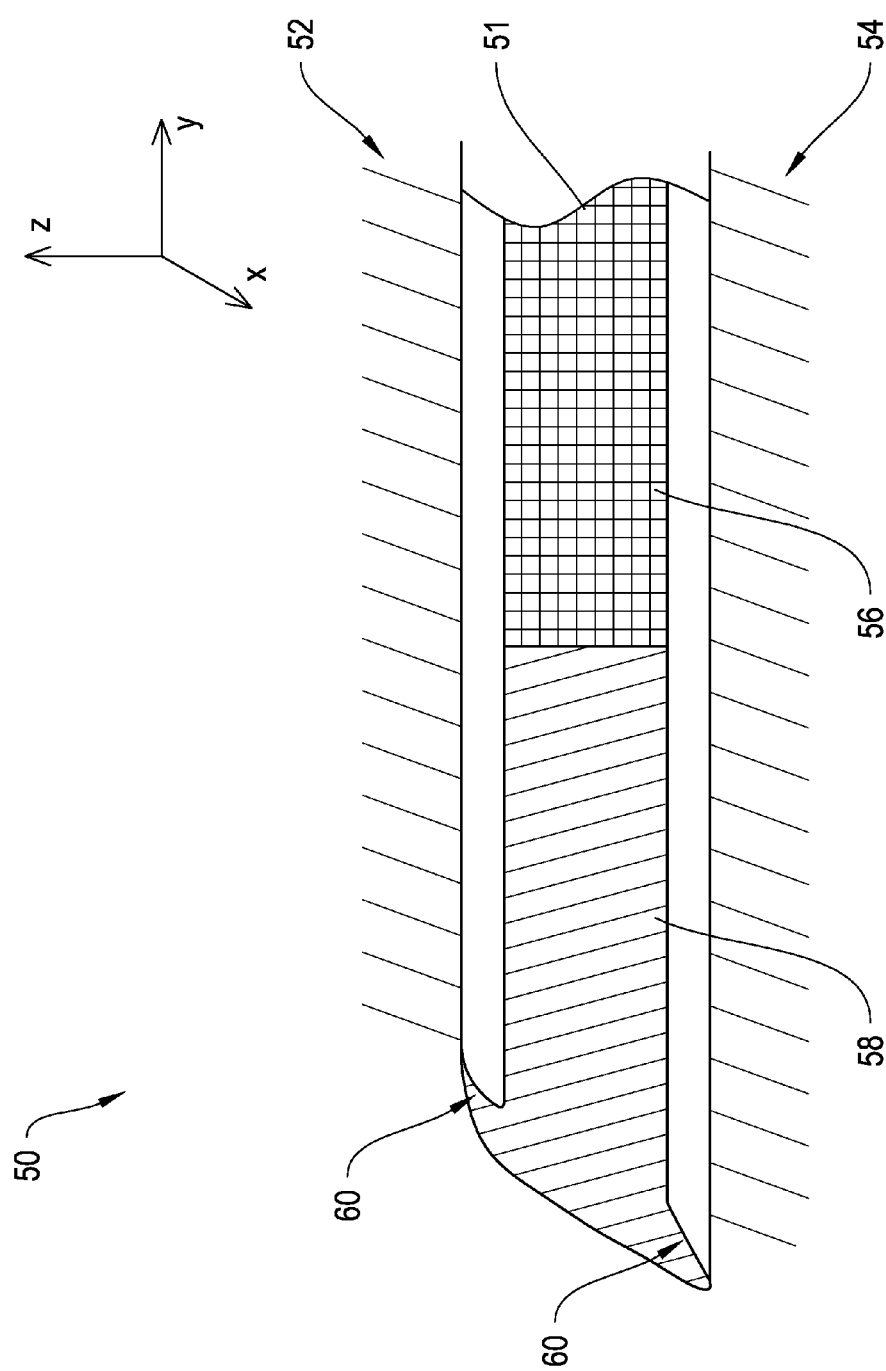
FIG. 3 is a side view of an alternative embodiment of the gasket assembly of the invention including a gasket with an aerodynamic design to minimize drag.

FIG. 3 illustrates an alternative gasket design of the branched ends 60 of gasket 51. The gasket assembly 50 represents a section of an external aircraft antenna, and is shown positioned between conductive avionics surfaces 52 and 54. Gasket 51 includes corrugated mesh sheet 56 and chemically resistant elastomer 58. Gasket branched ends 60 are designed to present an aerodynamically shaped profile with low drag and wind resistance, while maintaining an environmental sealing function.

The gaskets of the invention can be used in a variety of applications and under a variety of environmental conditions. One particularly useful application is for avionics, on both military and civilian aircraft, and particularly for external aircraft seals used to bond exterior electrical and electronic components, such as antennas, lights and altimeters, etc., to the aircraft skin, to provide EMI shielding and sealing around such components. Due to the high resistance to corrosion of the gaskets of the invention, the gaskets can be used in applications other than aviation where a harsh operating environment and a flat gasket form fits the mechanical design of the particular application.

As it is anticipated that certain changes may be made in the present invention without departing from the precepts herein involved, it is intended that all matter contained in the foregoing description shall be interpreted as illustrative and not in a limiting sense. All references cited herein are expressly incorporated herein by reference thereto in their entirety.

What is claimed is:

1. An EMI and corrosion resistant assembly comprising
   a first conductive surface comprising an external aircraft component surface;
   a second conductive surface spaced apart from the first conductive surface, and comprising a second external aircraft surface; and a composite gasket interposed and in electrical contact with the first and second conductive surfaces, wherein the composite gasket comprises a resilient, electrically-conductive mesh sheet extending along an x-axis and a y-axis, axis, mesh sheet being adapted for electrical contact between adjacent first and second conductive surfaces;

a gel matrix material applied to the mesh sheet; and a non-conductive chemically resistant elastomer affixed to the outer periphery of said mesh sheet, extending along the x-axis and y-axis; an end portion of said elastomer comprising a branched sealing element having a first branch portion and a second branch portion extending above and below the mesh sheet respectively, along a z-axis beyond the x-y plane of the mesh sheet, for contacting the adjacent conductive first and second surfaces, said branched sealing element being deformable along the z-axis.

2. The assembly of claim 1 which is at least part of an external aircraft electronic component.

3. The assembly of claim 2, wherein the branched sealing element is in the shape of a forked element.

4. The assembly of claim 1 which is an external aircraft antenna.

5. The assembly of claim 4 wherein the branched sealing element is in the shape of a fillet conforming to the aerodynamic shape of an external aircraft electronic component.

6. The assembly of claim 1 wherein the mesh sheet is corrugated.

7. The assembly of claim 1 wherein the mesh sheet comprises one or more electrically-conductive fibers.

8. The assembly of claim 7 wherein the electrically-conductive fibers are non-conductive fibers having an electrically-conductive coating, metal wires, carbon fibers, graphite fibers, inherently-conductive polymer fibers, or a combination thereof.

9. The assembly of claim 7 wherein:

the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof; and the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

\* \* \* \* \*